United States Patent [19]

Gazsi

[11] Patent Number: 5,243,548
[45] Date of Patent: Sep. 7, 1993

[54] INTEGRATABLE CIRCUIT CONFIGURATION WITH AN ANALOG NETWORK

[75] Inventor: Lajos Gazsi, Düsseldorf, Fed. Rep. of Germany

[73] Assignee: Siemens Aktiengesellschaft, Munich, Fed. Rep. of Germany

[21] Appl. No.: 947,725

[22] Filed: Sep. 18, 1992

[30] Foreign Application Priority Data

Sep. 18, 1991 [EP] European Pat. Off. ........ 91115876.4

[51] Int. Cl.$^5$ ............................................. G06J 1/00
[52] U.S. Cl. .................................................. 364/602
[58] Field of Search .............. 364/602, 724.01, 724.16, 364/724.19, 825

[56] References Cited

U.S. PATENT DOCUMENTS

| 4,803,647 | 2/1989 | Dieterich | 364/724.17 |
| 4,809,203 | 2/1989 | Wilson et al. | 364/602 |
| 5,052,027 | 9/1991 | Poklemba et al. | 364/724.01 X |

OTHER PUBLICATIONS

Zie Voor Titel Boek, de 2e Pagina, (1983) pp. 371–375, "Microelectronic Analog Active Filters" (Schaumann).
IEEE Journal, vol. SC-20, No. 6, Dec. 1985, pp. 1114–11121, (Banu et al) "An Elliptic Continuous-Time CMOS Filter with etc.".
IEEE Journal, vol. SC-21, No. 1, Feb. 1986, pp. 15–30, (TSIVIDIS et al) "Continous-Time MOSFET-C Filters in VLSI".

*Primary Examiner*—Tan V. Mai
*Attorney, Agent, or Firm*—Herbert L. Lerner; Laurence A. Greenberg

[57] ABSTRACT

An integratable circuit configuration includes an analog signal network being subject to fluctuations in a given way. An analog/digital converter is connected downstream of the analog signal network. A digital signal network is connected downstream of the analog/digital converter for receiving settable coefficients. An analog comparison network being subject to the fluctuations in the same given way receives an excitation signal and supplies a response signal in response to the excitation signal. An evaluation circuit is connected to the analog comparison network and to the digital signal network for comparing the response signal with a reference signal and setting the coefficients of the digital signal network as a function of the comparison. According to another embodiment, a digital/analog converter is connected upstream of the analog signal network. Then the digital signal network is connected upstream of the digital/analog converter.

12 Claims, 2 Drawing Sheets

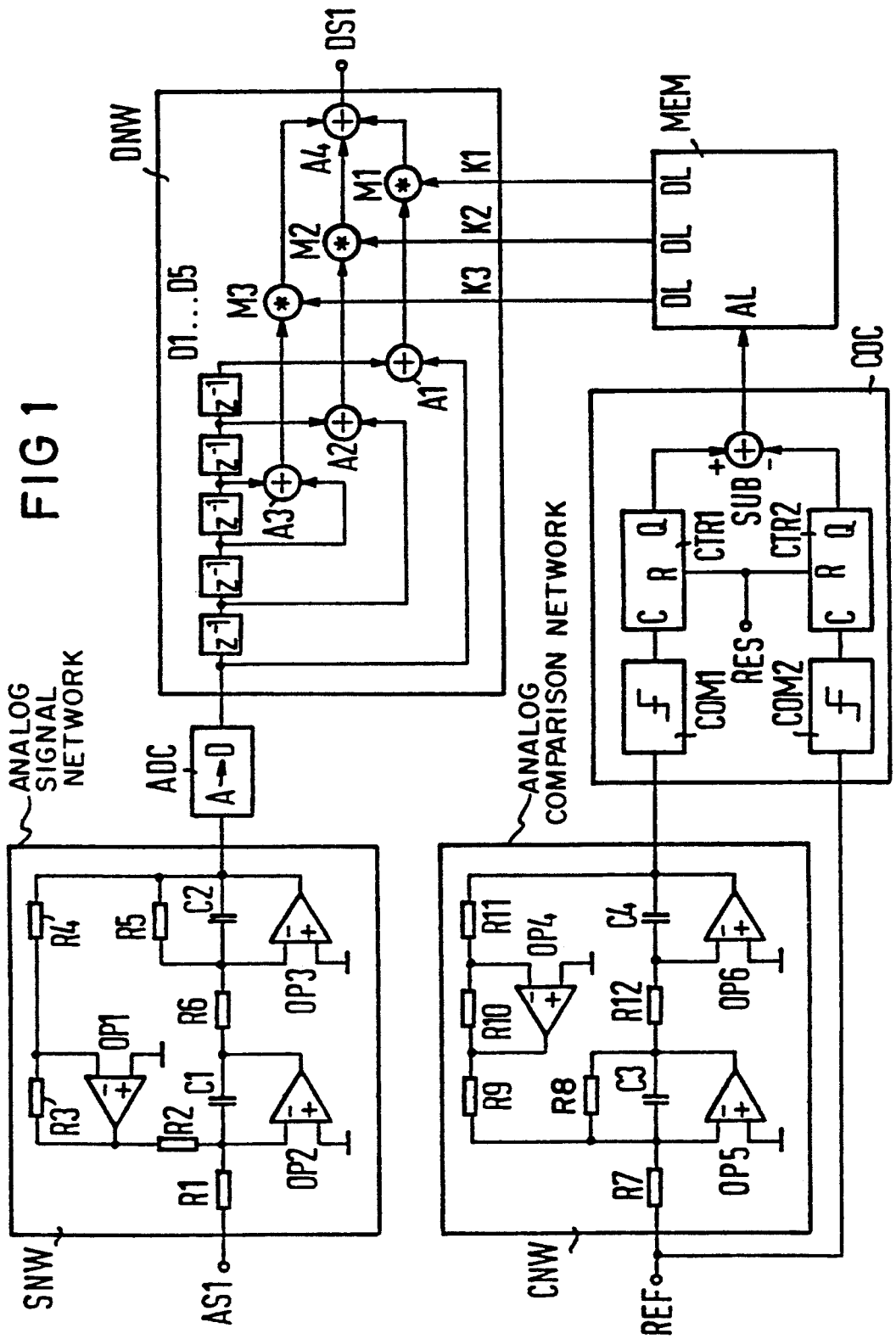

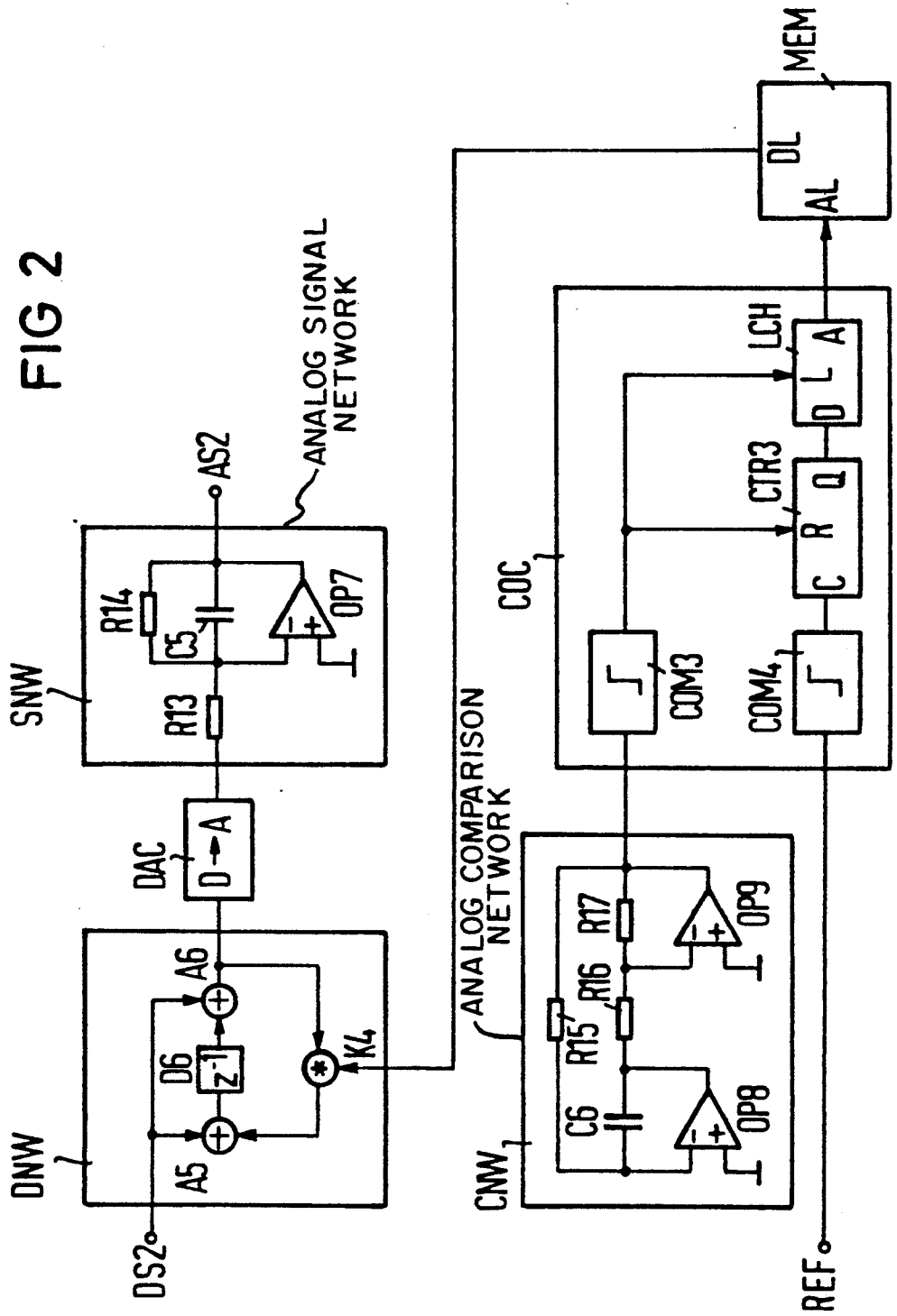

INTEGRATABLE CIRCUIT CONFIGURATION WITH AN ANALOG NETWORK

BACKGROUND OF THE INVENTION

Field of the Invention

The invention relates to an integratable circuit configuration with an analog network.

High-accuracy networks with resistors and capacitors are still usually made by discrete or hybrid technology. Although the expenditure for circuitry is quite high, nevertheless such techniques so far have been best able to meet the necessary demand for absolute accuracy, production tolerances, long-term stability and temperature response.

In contrast, integrated circuitry networks require a very slight expenditure for circuitry. However, they have the disadvantage of producing resistors and capacitors that are subject to major fluctuations dictated by production tolerances and temperature factors. High absolute accuracy and high constancy is attainable only at considerable additional expense.

DESCRIPTION OF THE RELATED ART

However, a paper by M. Banu and Y. Tsividis, entitled "An Elliptic Continuous-Time CMOS-Filter With On-Chip Automatic Tuning", in IEEE Journal of Solid-State Circuits, Vol. SC-20, No. 6, December 1985, and a paper by Y. Tsividis, M. Banu and J. Khoury, entiled "Continuous-Time MOSFET-C Filters in VLSI", in IEEE Journal of Solid-State Circuits, Vol. SC-21, No. 1, February 1986, describe an integratable circuit configuration with a filter that has the usual capacitors, but its resistors are replaced by MOS field effect transistors. Triggering of the MOS field effect transistors is carried out by a phase detector connected downstream of a loop filter. The phase detector in turn compares a reference signal with the output signal of an oscillator or with the response signal of a further filter that is excited by the reference signal.

The oscillator and the further filter have MOS field effect transistors and capacitors, which are identical in layout to the MOS field effect transistors and capacitors of the first-mentioned filter. In integrated circuitry, it is assumed that instead of high absolute accuracy, a high relative accuracy between two or more components of identical layout is attained. The oscillator or the further filter is a component of a phase locked loop which, with respect to the reference signal, adjusts the oscillator or the further filter with high absolute accuracy through the MOS field effect transistors. The MOS field effect transistors of the first-mentioned filter are triggered by the same signals as the oscillator or the further filter, so that in this respect as well, high absolute accuracy is attained.

A broad field to which such analog networks applies is particularly in digital signal processing devices which are fully integratable including the analog/digital and digital/analog converters, but in which analog filters connected upstream or downstream must usually have a discrete layout. It is therefore a goal to integrate the analog filters as well, while keeping the effort and expense therefor as low as possible. However, in the known version, the effort and expense for calibrating the analog closed-loop circuit is quite high.

It is accordingly an object of the invention to provide an integratable circuit configuration with an analog network, which overcomes the hereinafore-mentioned disadvantages of the heretofore-known devices of this general type.

SUMMARY OF THE INVENTION

With the foregoing and other objects in view there is proved, in accordance with the invention, an integratable circuit configuration, comprising an analog signal network being subject to fluctuations in a given way; an analog/digital converter connected downstream of the analog signal network; a digital signal network connected downstream of the analog/digital converter for receiving settable coefficients; an analog comparison network being subject to the fluctuations in the same given way, the analog comparison network receiving an excitation signal and supplying a response signal in response to the excitation signal; and an evaluation circuit connected to the analog comparison network and to the digital signal network for comparing the response signal with a reference signal and setting the coefficients of the digital signal network as a function of the comparison.

In accordance with another feature of the invention, there is provided a memory connected between the evaluation circuit and the digital signal network for storing various values for the coefficients, the evaluation circuit selecting predetermined values for setting each of the coefficients of the digital signal network.

In accordance with a further feature of the invention, the analog comparison network is a band-pass filter to which the reference signal is applied as the excitation signal.

In accordance with an added feature of the invention, the evaluation circuit has a digital phase detector.

In accordance with an added feature of the invention, the analog signal network and the analog comparison network include identical resistors and capacitors.

With the objects of the invention in view, there is also provided an integratable circuit configuration, comprising an analog signal network being subject to fluctuations in a given way; a digital/analog converter connected upstream of the analog signal network; a digital signal network connected upstream of the digital/analog converter for receiving a settable coefficient; an analog comparison network being subject to the fluctuations in the same given way, the analog comparison network receiving an excitation signal and supplying a response signal in response to the excitation signal; and an evaluation circuit connected to the analog comparison network and to the digital signal network for comparing the response signal with a reference signal and setting the coefficient of the digital signal network as a function of the comparison.

In this embodiment as well, in accordance with another feature of the invention, there is provided a memory connected between the evaluation circuit and the digital signal network for storing various values for the coefficient, the evaluation circuit selecting predetermined values for setting the coefficient of the digital signal network.

In accordance with a further feature of the invention, the analog comparison network is an oscillator circuit in which the excitation signal is equal to the response signal.

In accordance with an added feature of the invention, the evaluation circuit has a digital frequency detector.

In accordance with a concomitant feature of the invention, the analog signal network and the analog comparison network include identical resistors and capacitors in this embodiment as well.

Other features which are considered as characteristic for the invention are set forth in the appended claims.

Although the invention is illustrated and described herein as embodied in an integratable circuit configuration with an analog network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of a first embodiment of a circuit configuration according to the invention; and FIG. 2 is a schematic and block circuit diagram of a second embodiment of a circuit configuration according to the invention.

DESCRIPTION OF THE PREFERRED EMBODIMENT

Referring now to the figures of the drawing in detail and first, particularly, to FIG. 1 thereof, there is seen a circuit configuration according to the invention which includes an analog signal network SNW with resistors R1 . . . R6 and capacitors C1, C2, an analog/digital converter ADC connected downstream thereof and a digital signal network DNW being connected downstream of the converter ADC and having settable coefficients K1, K2, K3. An analog comparison network CNW with resistors R7 . . . R12 and capacitors C3, C4 is also provided. The resistors R7 ... R12 and the capacitors C3, C4 are identical to the resistors R1 . . . R6 and the capacitors C1, C2 of the analog signal network SNW and an excitation signal is applied thereto. Finally, the circuit configuration according to the invention includes an evaluation circuit COC, which compares a response signal output by the analog comparison network CNW in response to the excitation signal, with a reference signal REF and sets the coefficients K1, K2, K3 of the digital signal network DNW as a function thereof.

According to a further feature of the invention, setting of the coefficients K1, K2, K3 is carried out by means of a memory MEM which is connected between the evaluation circuit COC and the digital signal network DNW and in which different values for the coefficients K1, K2, K3 are stored. In setting the coefficients K1, K2, K3 of the digital signal network DNW, various predetermined values are selected by the evaluation circuit COC and transferred to the digital signal network DNW. For this purpose, a data word is transmitted over address lines AL of the memory MEM from the evaluation circuit COC to the memory MEM. This data word represents a certain address. At this address, one predetermined value is stored in the memory for each coefficient K1, K2, K3 and is thereupon passed on to the digital signal network DNW over data lines DL.

The evaluation circuit COC includes a digital phase detector with two counters CTR1, CTR2 and one subtractor SUB. The counter CTR1 is triggered with the response signal of the comparison network CNW and the counter CTR2 is triggered with the reference signal REF. These signals are each applied to a counting input C of the applicable counter CTR1, CTR2. Outputs Q of the two counters CTR1, CTR2 are each carried to a respective input of the subtractor SUB. The subtractor SUB has an output which is connected to the address line AL of the memory MEM. Reset inputs R of the two counters CTR1, CTR2 are joined together and at predetermined time intervals are reset by a reset signal RES. Each of the two counters CTR1, CTR2 is preceded by a respective comparator COM1, COM2, in order to increase the edge steepness of the applicable signals, but in particular of the response signal of the comparison network CNW.

The comparison network CNW is constructed as a bandpass filter with three operational amplifiers OP4, OP5, OP6, having non-inverting inputs which are each connected to a reference potential. The operational amplifiers OP4, OP5, OP6 are negatively fed back between an output and an inverting input. The operational amplifier OP4 is negatively fed back through the resistor R10, the operational amplifier OP6 is negatively fed back through the capacitor C4, and the operational amplifier OP5 is negatively fed back through the capacitor C3 and the resistor R8 connected parallel thereto. The inverting input of the operational amplifier OP6 is connected through the resistor R12 to the output of the operational amplifier OP5, which has an inverting input that in turn is first coupled to the output of the operational amplifier OP4 through the resistor R9 and second is acted upon through the resistor R7 by the excitation signal, namely the reference signal REF. The inverting input of the operational amplifier OP4 is coupled through the resistor R11 to the output of the operational amplifier OP6, which simultaneously forms the output of the comparison network CNW and thus carries the response signal.

The analog signal network SNW likewise includes three operational amplifiers OP1, OP2 and OP3, having non-inverting inputs which are at the reference potential. The operational amplifiers are each fed back negatively between an output and an inverting input thereof as follows: the operational amplifier OP1 is fed back through the resistor R3, the operational amplifier OP2 is fed back through the capacitor C1, and the operational amplifier OP3 is fed back through the capacitor C2 and the resistor R5 connected parallel thereto. The inverting input of the operational amplifier OP1 is connected through the resistor R4 to the output of the operational amplifier OP1. The inverting input of the operational amplifier OP1 in turn is coupled through the resistor R6 to the output of the operational amplifier OP2. The inverting input of the operational amplifier OP2 is connected through the resistor R2 to the output of the operational amplifier OP1 and through the resistor R1 to an analog signal AS1. Connected downstream of the output of the operational amplifier OP3 is the analog-digital converter ADC, which in turn is followed by the digital signal network DNW.

In the present exemplary embodiment, a nonrecursive digital filter, an FIR filter, is provided as the digital signal network DNW, which has first through fifth series-connected delay elements D1 . . . D5. Outputs of all the delay elements D1 . . . D5 and an input of the first delay element D1 are each coupled to one another in pairs in such a manner that the input of the first delay element D1 and the output of the last delay element D5;

the input of the second delay element D2 and the output of the fourth delay element D4; and the input and the output of the third delay element D3 are each connected to an input of a respective adder A1, A2, A3, having outputs which are carried, with the interposition of a respective multiplier M1, M2, M3, to inputs of an adder A4. An output of the adder A4 forms the output of the digital signal network DNW, which carries a digital signal DS1. The coefficients K1, K2, K3 are applied to respective further inputs of the multipliers M1, M2, M3.

The exemplary embodiment of FIG. 2 is modified as compared with that of FIG. 1 in such a way that the digital signal network DNW is acted upon on the input side by a digital signal DS2; that a digital/analog converter DAC is connected downstream of the digital signal network DNW; and that the converter is followed by the analog signal network SNW. Moreover, the digital signal network DNW is constructed as a recursive digital filter, which has a delay element D6. The delay element D6 is connected downstream of an adder A5, having one input that is acted upon by the digital signal DS2 and another input that is connected to the output of a multiplier M4. One input of the multiplier M4 is coupled to an output of an adder A6. The adder A6 has one input which is acted upon by the digital signal DS2 and another input which is coupled to the output of the delay element D6. A coefficient K4 is applied to a further input of the multiplier M4. The input of the digital/analog converter DAC is also connected to the output of the adder A6.

The analog signal network SNW includes an operational amplifier OP7, having a non-inverting input which is at the reference potential and which is fed back between an output and an inverting input thereof through a resistor R14 and a capacitor C5 connected parallel thereto. The inverting input of the operational amplifier OP7 is moreover connected to the output of the digital signal network DNW through a resistor R13. An analog signal AS2 is present at the output of the operational amplifier OP7, which forms the output of the analog signal network SNW.

The coefficient K4 for the digital signal network DNW is furnished by the memory MEM over its data lines DL. The selection of the appropriate memory location is effected in turn over the address lines AL, which are connected to the output of the evaluation circuit COC. In the exemplary embodiment of FIG. 2, the evaluation circuit COC includes a digital frequency comparator, which substantially has a counter CTR3 and a memory element or latch LCH. The response signal of the comparison network CNW is applied to both the reset input R of the counter CTR3 and one control input L of the memory element LCH. The counting input C of the counter CTR3 is acted upon the reference signal REF. One comparator COM3 is connected upstream of the reset input R of the counter CTR3 and of the control input L of the memory element LCH, and another comparator COM 4 is connected upstream of the counting input C of the counter CTR3, in order to increase the edge steepness of the response signal of the comparison network CNW and of the reference signal REF.

In the exemplary embodiment of FIG. 2, the comparison network CNW is constructed as an oscillator circuit. The oscillator circuit includes two operational amplifiers OP8 and OP9, having non-inverting inputs which are at reference potential. An inverting input and an output of the operational amplifier OP8 are coupled to one another through a capacitor C6 and an inverting input and an output of the operational amplifier OP9 are coupled to one another through a resistor R17. The output of the operational amplifier OP9 is also connected through a resistor R15 to the inverting input of the operational amplifier OP8. The output of the operational amplifier OP8 in turn is connected through a resistor R16 to the inverting input of the operational amplifier OP9. The response signal of the analog comparison network CNW, which simultaneously represents the excitation signal, is present at the output of the operational amplifier OP9.

In a circuit configuration according to the invention, a mixed analog/digital system is always assumed. Two signal networks that are tuned to one another, one of which is analog and the other of which is digital, are disposed around the necessary analog/digital and digital/analog converters. The digital signal network DNW is always adjusted in such a way that it compensates for the fluctuations in the analog signal network SNW and keeps the total transmission response constant. To that end, the fluctuations in transmission response of the analog signal network SNW are determined. This is performed by means of the analog comparison network CNW, having a transmission response which varies in proportion to that of the signal network SNW. The variations in the transmission response of the analog comparison network CNW are detected by means of the evaluation circuit COC, and the coefficient or coefficients of a digital signal network is thereupon varied accordingly. In other words, this involves an open-loop control circuit, in contrast to the known configuration which involves a closed-loop control circuit, or more specifically a phase-locked loop. Moreover, in the circuit configuration of the invention, again in contrast to the known configuration, the analog networks, that is the signal network SNW and the comparison network CNW, are not changed. The resistors R1 . . . R17 that are used are accordingly not controllable. Aside from fluctuations caused by temperature and production factors, these resistors R1 . . . R17 can be considered constant.

In principle, the layout of the analog signal network SNW is arbitrary and essentially depends on the particular application. In other words, besides the embodiments shown with low-pass behavior, a number of other embodiments are also possible, which differ from one another, for instance, in the transmission response and/or structurally in terms of circuitry. Besides the asymmetrical embodiment of the signal network SNW as shown, a symmetrical embodiment is also possible.

In the same manner, within wide limits, the layout of the analog/digital converter ADC or of the digital/analog converter DAC depends on the particular application and therefore need not be described in further detail herein. In principle, however, all of the usual converter types can be used in this case as well.

The digital signal network DNW can also be constructed in various ways. The transmission response of the digital filter DF is tuned to the transmission response of the analog signal network SNW. By varying the coefficient or coefficients K1 . . . K4, the transmission response is varied in such a manner that the fluctuations in the transmission response of the analog signal network SNW are compensated for. Once again, the embodiment may use either nonrecursive or recursive structures, such as wave digital filters.

The setting of the coefficients K1 ... K4 should be carried out as a function of the fluctuations in the analog signal network SNW. However, the fluctuations of the analog signal network SNW are not measured directly. Instead, the fluctuations of the comparison network CNW are ascertained. It is assumed in this case that the fluctuations of the comparison network CNW are proportional to the fluctuations of the analog signal network SNW. This means that the comparison network CNW is subjected to the fluctuations in the same way as is the analog signal network SNW. In order to attain synchronism of the fluctuations, the resistors R1 ... R17 and capacitors C1 ... C6 that determine the transmission response are, for instance, constructed identically in the signal network SNW and the comparison network CNW. Different resistances and capacitances are then generated by a parallel or serial connection of the same elements. The relative accuracy and the synchronism of the various elements to one another in general is intrinsically quite high, given an embodiment in integrated technology. However, the signal network SNW and the comparison network CNW need not have an identical transmission response. For instance, the signal network SNW may be a low-pass filter while the comparison network CNW may be a band-pass filter, or a feedback network of an oscillator with band-pass response.

In order to ascertain the fluctuations of the comparison network CNW, the evaluation circuit COC measures a variable that is characteristic for the fluctuation in the transmission response. This characteristic variable is the phase in the exemplary embodiment of FIG. 1, and in the exemplary embodiment of FIG. 2, it is the frequency of the response signal of the comparison network CNW. In the phase measurement, it is assumed that the phase displacement in the pass range of a band pass is equal to zero. Then, if the band pass, as an analog comparison network CNW, is triggered with the reference signal Ref and the response signal is then compared with that signal, changes in the pass range that are due to changes in the resistances and capacitances can be ascertained in the form of a phase displacement. In contrast, in the exemplary embodiment of FIG. 2, the frequency of an oscillator, which has a resistor and a capacitor as its frequency-determining elements, is measured. In this case, the frequency of the oscillator is ascertained with reference to the frequency of the reference signal REF by the evaluation circuit COC, and changes in the resistance and capacitance are thus ascertained in the form of changes in frequency.

According to a further feature of the invention, the evaluation circuit COC is constructed as a digital phase comparator or frequency comparator which has one or more counters, among other elements. The differences in phase or frequency are then output as a digital variable in each case. This has the advantage of not needing an additional analog/digital converter, so that the total expenditure for circuitry is quite low.

Due to the use of the memory MEM, which converts the value of the fluctuation ascertained by the evaluation circuit COC into a corresponding variation of the coefficient or coefficients K1 ... K4, tuning of the digital signal network DNW to the analog signal network SNW is not only easy to do by machine, in particular under computer control, but it also enables the attainment of a high absolute accuracy.

A circuit configuration according to the invention is furthermore distinguished by a very low expenditure for analog circuitry and because of the predominantly digitally realized functions, it is also distinguished by high replicability. Feedback to the signal branch is also extremely low, since transient responses and closed-loop control are dispensed with and therefore have no influence on the signal branch, because an open-loop control circuit is used instead of a closed-loop control circuit.

In closing, it should be pointed out that the evaluation circuit COC preferably has hysteresis response. To that end, the counters CTR1, CTR2, CTR3 or the subtractor SUB are constructed accordingly, by way of example. If the transmission response of the analog comparison filter CNW is varied, a variation in the addresses on the address line AL does not occur until a predetermined threshold value is reached. As is conventional in hysteresis response, the threshold value differs depending on the direction of the variation.

Moreover, the analog signal networks can be combined not only with the digital networks but also with switched capacitor networks, which are likewise controlled by the evaluation circuit.

I claim:

1. Integratable circuit configuration, comprising
   (a) an analog signal network receiving an analog input signal and providing an analog output signal and having a transfer function being subject to fluctuations in a given way with respect to a desired transfer function;
   (b) a digital signal network receiving a digital input signal and providing a digital output signal and having a transfer function being adjustable by at least one filter coefficient;
   (c) an analog/digital converter connected downstream of said analog signal network and upstream of said digital signal network;
   (d) an analog comparison network receiving an excitation signal and providing a response signal in response to the excitation signal, said analog comparison network having a transfer function being subject to the fluctuations in the given way; and
   (e) an evaluation circuit connected to said analog comparison network and to said digital signal network for setting the at least one filter coefficient of said digital signal network as a function of the response signal for performing the desired transfer function.

2. The circuit configuration according to claim 1, including a memory connected between said evaluation circuit and said digital signal network for storing various values for the coefficients, said evaluation circuit selecting predetermined values for setting each of the coefficients of said digital signal network.

3. The circuit configuration according to claim 1, wherein said analog comparison network is a band-pass filter to which the reference signal is applied as the excitation signal.

4. The circuit configuration according to claim 3, wherein said evaluation circuit has a digital phase detector.

5. The circuit configuration according to claim 1, wherein said analog signal network and said analog comparison network include identical resistors and capacitors.

6. The circuit configuration according to claim 1, wherein said at least one filter coefficient is a plurality of filter coefficients.

7. Integratable circuit configuration, comprising (a) an analog signal network receiving an analog input signal and providing an analog output signal, said analog signal network having a transfer function being subject to fluctuations in a given way with respect to a desired transfer function;

(b) a digital signal network receiving a digital input signal and supplying a digital output signal, said digital signal network having a transfer function being adjustable by at least one filter coefficient;

(c) a digital/analog converter connected upstream of said analog signal network and downstream of said digital signal network;

(d) an analog comparison network providing a response signal being subject to the fluctuations in the given way; and (e) an evaluation circuit connected to said analog comparison network and to said digital signal network for setting the at least one filter coefficient of said digital signal network as a function of the response signal for performing the desired transfer function.

8. The circuit configuration according to claim 7, including a memory connected between said evaluation circuit and said digital signal network for storing various values for the coefficient, said evaluation circuit selecting predetermined values for setting the coefficient of said digital signal network.

9. The circuit configuration according to claim 7, wherein said analog comparison network is an oscillator circuit in which the excitation signal is equal to the response signal.

10. The circuit configuration according to claim 9, wherein said evaluation circuit has a digital frequency detector.

11. The circuit configuration according to claim 6, wherein said analog signal network and said analog comparison network include identical resistors and capacitors.

12. The circuit configuration according to claim 7, wherein said at least one filter coefficient is a plurality of filter coefficients.

* * * * *